July 22, 1969 P. G. ANDRUS 3,456,586

PROCESS FOR MAKING AND USING A RELIEF PRINTING MASTER

Filed Dec. 28, 1966

INVENTOR.
PAUL G. ANDRUS

BY Donald C. Kolasch
James J. Kalarota
ATTORNEYS

United States Patent Office 3,456,586

Patented July 22, 1969

3,456,586

PROCESS FOR MAKING AND USING A RELIEF PRINTING MASTER

Paul G. Andrus, Powell, Ohio, assignor to Xerox Corporation, Rochester, N.Y., a corporation of New York Filed Dec. 28, 1966, Ser. No. 605,392

Int. Cl. B41b *1/02*; B41n *1/00*; B29c *1/02*

U.S. Cl. 101—401.1 11 Claims

ABSTRACT OF THE DISCLOSURE

This invention relates to a method of preparing a relief printing master utilizing principles of selective wetting. An image having one specific wetting property is formed on the surface of a substrate having wettability characteristics opposite to those of the formed image. By selecting the proper die forming material a die may be formed from which a molded printing master may be prepared.

This invention relates to an imaging system and, more specifically to a contact imaging system.

Relief or typographical printing is a contact method of printing whereby the image areas of the printing plate are substantially raised above the flat reference surface of the plate. Letterpress printing is the classical form of relief or contact printing whereby a relief or raised image is formed, usually by an etching process, above the flat reference surface of the printing plate. As a result of the raised relief nature of the image characters, the subsequently applied printing ink contacts only the image surface depositing ink in an imagewise configuration. The ink image may then be transferred directly upon contact to a copy sheet. Letterset printing is generally an offset contact printing technique whereby a relief image is prepared and developed with the resulting image being transferred initially to an offset surface, such as an offset blanket, from where it is in turn transferred upon contact to the final copy sheet.

A number of techniques are known whereby contact printing plates may be produced for subsequent use as printing masters. For example, it has been known to prepare relief printing plates by first exposing a negative image of the original to the surface of a plate pre-coated with a photosensitive composition, developing the exposed plate and etching, thereby preparing the relief image to serve as the printing surface. Stereos for newspaper printing are generally prepared by casting a relief printing plate from a mold or impression surface conventionally referred to as a mat. More recently, a method of producing a relief printing plate utilizing the process of electrostatic imaging has been developed. This process, in general, consists of placing an electrostatic charge on the surface of a photoconductive plate comprising a volatilizible photoconductive insulating layer on a metal base, selectively exposing the plate to a light source thereby producing an electrostatic latent image on the surface of the plate, developing the electrostatic latent image with a particulate electroscopic material, heating to drive off the volatile photoconductive composition in the non-image areas and to fix the developed image to the metal surface, cooling and then etching the plate with an etchant solution to remove the metal not masked by the resinous image, thereby leaving the image in relief. A second electrostatic approach consists of placing an electrostatic charge on a photoconductive plate comprising a photoconductive composition such as selenium, developing the latent image with a substance which is resistant to the solvents for the photoconductor and removing the unwanted photoconductor from the non-image areas by a solvation action thereby exposing the backing plate which is further etched to produce the desired relief effect.

While these and other techniques have been found useful for producing contact or relief printing masters, there are inherent disadvantages to their use. For example, when using the photosensitive film technique of preparing a printing master, it is generally necessary to employ various chemical treatments, long exposure times and the use of the photosensitive plate relatively soon after preparation. In preparing the stereo block for printing it is first necessary to go through elaborate and time consuming preparations of a mould from a printing plate which itself is prepared utilizing elaborate photoengraving processes. When using the xerographic approach in preparing a relief printing plate it is generally necessary to remove the photoconductive material from the non-image areas of the plate, for example, by volatilization or by a solvent treatment, in order to expose the underlying substrate in anticipation of the etching process. Furthermore, by etching into the surface of the support substrate, the plate inherently becomes structurally weakened.

It is, therefore, an object of this invention to provide a relief imaging system which will overcome the above noted disadvantages.

It is a further object of this invention to provide a novel method for the preparation of a relief printing master.

Another object of this invention is to provide a process of using a novel relief printing plate.

Still a further object of this invention is to provide an imaging system utilizing a master prepared from a xerographic plate.

The foregoing objects and others are accomplished in accordance with this invention, generally speaking, by providing a method of preparing a relief printing plate wherein an image having one specific wetting property is deposited on the surface of a substrate having wettability characteristics opposite to that of the formed image. More specifically and preferably, the conventional xerographic imaging process is used for the formation of an electrostatic latent image on the surface of a photoconductive plate, a process more fully described in U.S. Patent 2,297,691. The electrostatic latent image formed is developed with electroscopic marking particles whereby the electrostatically charged particles are deposited on the plate in an imagewise configuration. The developed image is then transferred to the surface of a support substrate, such as copper and fixed thereto by a suitable technique such as by the application of heat. Relying upon a difference in wettability properties between the image and non-image areas, a die forming material is applied to the surface of the imaged plate thereby selectively wetting the plate and forming a raised surface surrounding the non-wetted areas. For example, an image bearing copper plate may be overcoated with a liquidized metallic material, such as mercury or molten Wood's metal the latter being a low melting point alloy, with the applied metallic material wetting only the copper surface in the non-image areas thereby forming a raised surface surrounding the image areas. Upon solidification, when necessary, of the applied coating or die forming material a mold or die is produced. A relief or contact printing plate is then cast in the mold or die utilizing any suitable moldable material, such as a thermoplastic resin, to form the relief printing master of the present invention. The resulting formed plate may then subsequently be removed from the die and used thereafter as a relief printing master.

It has been determined in the course of the present invention that upon the establishment of a difference in wettability between the image and non-image areas of a particular support substrate, and by selecting the proper material exhibiting the necessary surface tension properties which will selectively wet the support substrate in the respective area, preferably the background or non-image areas of the plate, one may effectively prepare from the resulting mold or die a relief or contact printing master. The difference in wettability is so determined such that the die material will form a contact angle of at least 90° with the image areas of the support substrate while it forms a contact angle of something less than 90° with the non-image areas of the support substrate. The contact angle is generally considered a measure of wettability of a particular liquid or molten material on a solid surface. As herein used, it is defined as being the angle through the liquid which is measured between the horizontal support surface and the tangent to the drop of the liquid at the point at which the surface of the drop intersects the horizontal surface. The tangent will be in a plane perpendicular to the horizontal surface which also passes through the center of the drop. This difference in wettability between the image and non-image areas forms the basis for the development of the die of the present invention from which a relief printing master may be prepared. Upon the disposition on the surface of a particular support substrate of a reproducible image, the wettability characteristics of the substrate may be controlled in such a way so as to produce a mold or die from which the desired printing master may be produced. Depending upon the requirements of the particular system the type of relief printing plate produced may be determined by the extent to which the particular die forming material or molten die material is applied. The depth of the characters of the resulting printing master will be determined by the specific plate desired, whether it be a letterset or letterpress printing master. In the first instance, for example, a relief image of from about 0.1 to about 5 mils is desirable in which case the liquidized die material is applied to the support substrate to a depth corresponding with that of the desired relief image. If the resulting plate is to be used in a letterpress capacity, it is desirable to produce a relief image of from about 1 to about 80 mils. In this instance, the liquidized die material will be applied so as to produce an equivalent corresponding character depth. It has further been determined that in some instances, depending upon the support substrate, sensitization of the substrate, with a sensitizing solution such as hydrochloric acid, will increase the wettability of the surface to the liquidized die material of the present invention.

The invention is illustrated in the accompanying drawings in which.

Figures 1, 2, 3, 4, 5:
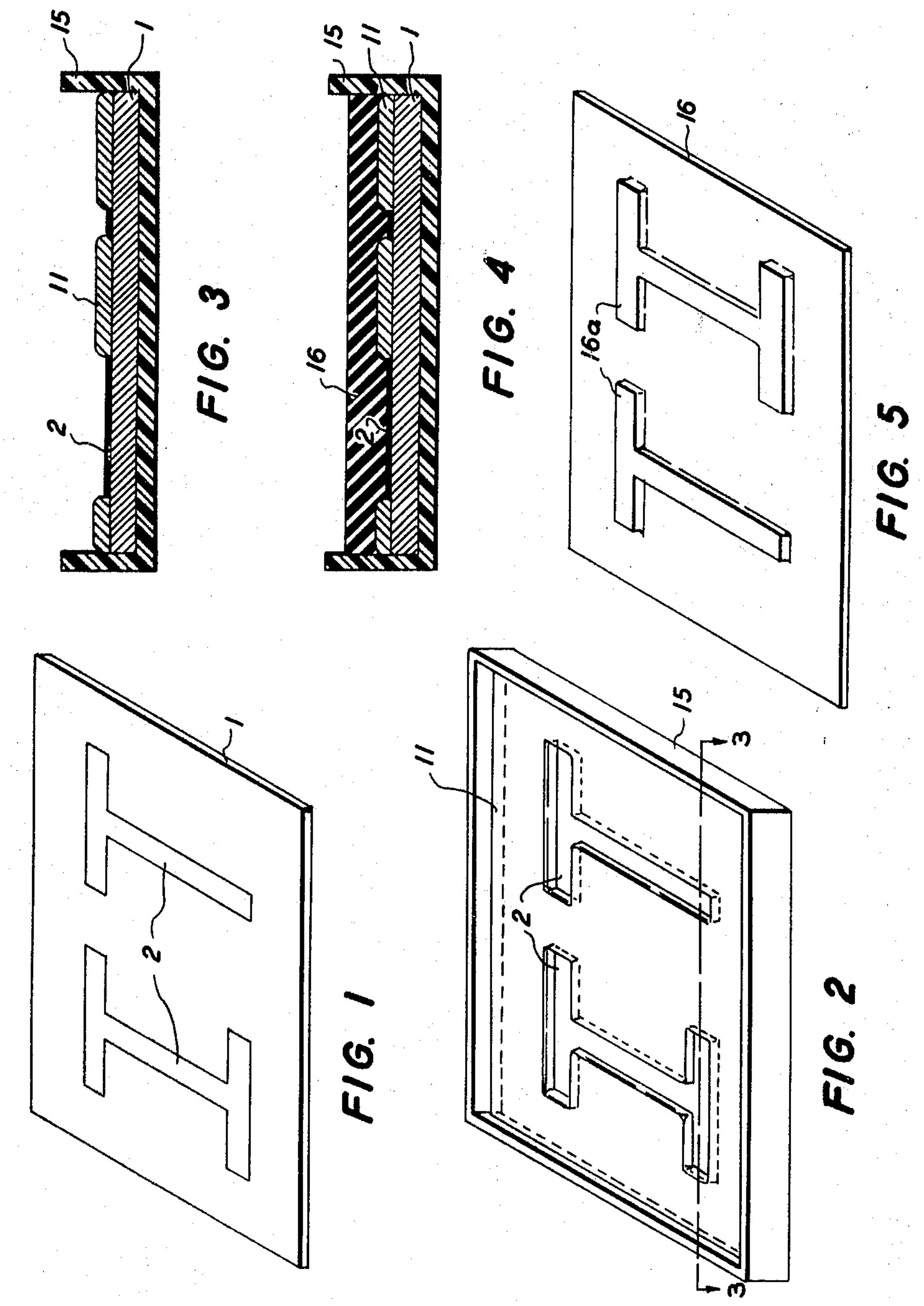
FIG. 1 represents a diagrammatic perspective view of a metallic support substrate with an electroscopic toner image fused thereto.
FIG. 2 represents a diagrammatic perspective view of the plate of FIG. 1 following application of a die forming material of the present invention.
FIG. 3 is a magnified cross section of the plate of FIG. 2.
FIG. 4 illustrates the application of the die prepared according to the process of the present invention for casting a relief printing plate.
FIG. 5 represents a relief printing master prepared according to the process of the present invention.

Referring now to FIG. 1, there is seen a support substrate 1, in this instance a copper plate, with an image 2 formed on the surface thereof such that it satisfies the present system requirements. For example, the image may be inscribed with a wax pencil or it may be formed by the transfer of an electrostatic toner image. The properties of the image material differ from that of the support substrate in such a manner such that each will present a different surface tension property when contacted with the same fluid or die forming material. For purposes of this illustration the image will consist of a resinous material such as polystyrene. In FIG. 2 is seen a jig 15 into which has been placed the image bearing plate of FIG. 1. To the surface of the plate is applied a fluid die forming material 11, such as mercury, which will selectively wet the non-image areas of the metal plate thereby producing a relief layer as illustrated, surrounding the initial image area 2. FIG. 3 represents a cross section through the plate complex of FIG. 2 sectioned as indicated at position 3, illustrating the relief formed by the die forming material 11 surrounding image areas 2.

In FIG. 4 a moldable material 16 has been poured onto the surface of the die with the bulk of the material confined by the boundaries of the jig 15. For the purposes of the instant illustration the molding material is represented as a silicone rubber. Upon cooling of the rubber molding material 16 the resulting molded rubber printing plate is removed from the die and jig complex. The result is a rubber printing master represented diagrammatically in FIG. 5 consisting of the rubber base 16 with a relief image *16a* formed on the plate's printing surface.

As mentioned above, any suitable image formation step may be employed in the course of the present invention such that there is established an image bearing support substrate with a difference in wettability between the image and non-image areas. For example, the plate may be prepared by typing or writing with a wax-like material on the surface of a metallic substrate; however, preferably the image is formed by the transfer of an electrostatic toner image, a procedure with which the process of the present invention is most suitably adapted. Likewise, any suitable support substrate may be chosen such that it provides the proper property differential between itself and the image which it supports so as to satisfy the wettability requirements of the present invention. Typical support materials are glass, copper, brass, stainless steel, aluminum, and nickel.

Any suitable die forming material may be used in the course of the present invention such that it selectively wets the support substrate therein used so as to provide the relief necessary to form the resulting die. Typical die forming materials include mercury, silica gel, water, and low melting, fusible alloys. The latter are usually, binary, ternary, quaternary, and quinary mixtures of bismuth, lead, tin, cadmium, indium and less frequently other metals. Exemplary of these types of fusible alloys are Wood's metal, an alloy composition having substantially a percentage composition of about 50% bismuth, 25% lead, 12.5% tin, and 12.5% cadmium; Cerrotru alloy which comprises substantially 58% bismuth and 42% tin; Cerrobase alloy, substantially 55.5% bismuth and 44.5% lead and Newton's metal having a percentage composition of about 50% bismuth, 31% lead, and 19% tin. The term fusible alloy generally means an alloy melting below about 450° F. The application of the die forming material may be carried out from either side of the imaged plate depending upon the physical properties of that plate. For example, if a porous plate is employed such as a silk screen, then the die forming material may be flowed up through the spaces of the screen in the non-imaged areas, applying a gentle hydrostatic pressure when necessary. Spreading and complete coverage may be assured by gently brushing or otherwise spreading the die forming material across the surface of the plate.

The material used to prepare the printing master from the die or mold of the present invention will fall into the category of any of the suitable typical casting materials used in the molding industry. Typical materials are plaster of paris, a calcium sulphate cement prepared by the complete or partial dehydration of gypsum; wax; thermoplastic resins such as casein, polystyrene, cellulose acetate, ethyl cellulose, methyl methacrylate, cellulose acetate butyrate, vinylidene chloride, vinyl chloride acetate; thermosetting resins such as epoxy resins, phenoic resins as, for example, phenol-formaldehyde resins and phenol furfural resins; rubber materials, both natural and synthetic, such as polyisoprene, a methylated butadiene, a silicone rubber, neoprene rubber, a chlorinated butadiene, and butyl rubber, a polymer of isobutylene and mixtures thereof.

To further define the specifics of the present invention the following examples are intended to illustrate and not limit the particulars of the present system. Parts and percentages are by weight unless otherwise indicated. The examples are also intended to illustrate various preferred embodiments of the present invention.

EXAMPLE I

A toner image comprising polystyrene is formed and developed on the surface of a photoconductive plate according to the process described in U.S. Patent 2,297,691. The image thus formed is electrostatically transferred according to the process of this patent to the surface of an insulating paper sheet. The image is rendered tacky by expsure to a solvent vapor atmosphere and then is contacted with the surface of a copper plate, the tacky image adhering to the latter plate upon removal of the copy sheet. By intensifying the vapor system the image is thus fused to the surface of the copper plate. The plate is then warmed on a thermostated hot plate held at about 200° F. Wood's metal, about 2 cu. cm. in volume, is placed on the plate and permitted to melt. A puddle of molten metal, about 30 mils deep, is formed on the non-image portions of the copper plate which will not wet the toner image. A dilute solution of HCl (5%) is applied to the surface of the copper plate in order to remove any superficial oxide layers that may be present. An artist's paint brush is used to brush the Wood's metal over the surface of the plate in order to insure that all of the exposed copper is wetted by the molten metal. The plate is then cooled rapidly by placing it on a cold metal slab. The resulting die is placed in a jig and a rubber relief plate cast therefrom by covering the solidified metallic mold with a liquid dental silicone impression rubber, Elasticon, commercially available from Kerr Mfg. Co., Detroit, Mich. The casting material is allowed to solidify. The jig is then opened and the resulting rubber master plate removed therefrom and used to print copies of the original type by applying conventional printing inks to the relief characters and contacting the ink characters with a copy sheet.

EXAMPLE II

The process of Example I is repeated excepting mercury is substituted for the Wood's metal wetting agent and the master plate is cast from a silicone rubber material. The resulting rubber plate produced is used as a relief printing plate whereby the relief areas are contacted with a conventional printer's ink and an imprint of the image on the relief plate transferred upon contact to the surface of a copy sheet.

EXAMPLE III

The process of Example I is repeated excepting the image is formed on the surface of the copper plate with a conventional wax pencil instead of by using electrostatic transfer techniques.

Although the present examples were specific in terms or conditions and materials used, any of the above listed typical materials may be substituted when suitable in the above examples with similar results. In addition to the steps used to prepare the relief printing master of the present invention, other steps or modifications may be used, if desirable. For example, a vibratory step may be employed during the wetting phase of the process to insure complete surface area coverage. In addition, other materials may be incorporated in the image, wetting agent, support base, or casting material which will enhance, synergize, or otherwise desirably effect the properties of these materials for the present use. For example, the casting material may have included therein a release agent which will enhance removal of the printing master from the die-jig configuration.

What is claimed is:

1. A method of preparing a relief printing member which comprises forming an electrostatic toner image on the surface of a support substrate, applying to the surface of said image bearing support substrate a die forming material in an amount sufficient to form a relief above the surface of said toner image areas, said material selectively coating the surface of said substrate in the non-image areas to form a die, applying a molding composition in a fluid state, solidifying said molding composition to form a printing member and separating said printing member from said die.

2. The process as disclosed in claim 1 wherein said support substrate comprises copper, said die forming material comprises a low melting fusible alloy, and said molding composition comprises a silicone rubber.

3. The process as disclosed in claim 1 wherein said relief ranges from about 1 to about 80 mils.

4. The process as disclosed in claim 1 wherein said die forming material is in a fluid state when applied.

5. The process as disclosed in claim 1 wherein said die forming material is made fluid after applying.

6. The process as disclosed in claim 1 further including the step of hardening said die forming material before applying said molding composition.

7. A method of preparing a relief printing member which comprises electrostatically forming a toner image on the surface of a metallic support substrate said image comprising a polystyrene composition, applying to the surface of said image bearing support substrate in an amount sufficient to form a relief above the surface of said toner image a die forming material comprising a low melting, fusible alloy having a percentage composition of about 50% bismuth, 25% lead, 12.5% tin and 12.5% cadmium, melting said die forming material so that said material selectively coats the surface of said substrate in the non-image areas forming a relief ranging from about 1 to about 80 mils surrounding the image areas, cooling said die forming material to form a die, applying a molding composition comprising a silicone rubber in a fluid state, solidifying said rubber composition to a hardened state to form a printing member and separating said relief printing member from said support die.

8. A method of preparing a relief printing member die which comprises electrostatically forming a toner image on the surface of a support substrate, applying to the surface of said image support substrate a die forming material in an amount sufficient to form a relief ranging from about 1 to about 80 mils above the toner image areas, said die forming material adhering only to the non-image areas of the support substrate.

9. The process as disclosed in claim 8 wherein said die forming material is made fluid after application to the imaged support substrate and further includes the step of hardening said die forming material.

10. A method of preparing multiple copies from a relief printing member which comprises:

(a) electrostatically forming a toner image on the surface of a support substrate, (b) applying to the surface of said toner image bearing substrate in a fluid state a die forming material in an amount sufficient to form a relief above the surface of said toner image areas, said die forming material selectively coating only the non-image areas of said image-bearing substrate, (c) hardening said die forming material to produce a die, (d) applying a molding composition in a fluid state, (e) solidifying said molding composition to a hardened state to form a printing member, (f) separating said solidified printing member from said die, (g) contacting the resulting printing surface of said solidified member with a printing ink, (h) contacting said inked surface with a copy sheet, and (i) repeating steps (g) and (h) at least one additional time.

11. The process as disclosed in claim 10 wherein said die forming material comprises a low melting fusible alloy and said molding composition comprises a silicone rubber.

References Cited

UNITED STATES PATENTS

| | | | |
|---|---|---|---|
| 13,587 | 9/1855 | Lowe | 101—458 |
| 308,043 | 11/1884 | Shaw | 101—401.2 |
| 548,320 | 10/1895 | Lowendahl | 101—401.2 |
| 921,397 | 5/1909 | Hartnett | 101—401.1 |
| 1,167,939 | 1/1916 | Scholz. | |
| 3,097,594 | 7/1963 | Bankhead | 101—128.4 |

FOREIGN PATENTS

| | | |
|---|---|---|
| 946,028 | 1/1964 | Great Britain. |

OTHER REFERENCES

Simonds, H.R., et al.: Handbook of Plastics, 2nd edition, reprinted 1952, New York, D. Van Nostrand Co.

ROBERT E. PULFREY, Primary Examiner

FREDERICK FREI, Assistant Examiner

U.S. Cl. X.R.

101—395; 264—219, 220, 225